United States Patent
Yamada et al.

(10) Patent No.: US 8,802,763 B2
(45) Date of Patent: Aug. 12, 2014

(54) CURABLE ORGANOPOLYSILOXANE COMPOSITION AND SEMICONDUCTOR DEVICE

(71) Applicant: Shin-Etsu Chemical Co., Ltd., Tokyo (JP)

(72) Inventors: Kunihiro Yamada, Annaka (JP); Nobuaki Matsumoto, Annaka (JP); Kenichi Tsuji, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1 day.

(21) Appl. No.: 13/633,983

(22) Filed: Oct. 3, 2012

(65) Prior Publication Data

US 2013/0087905 A1    Apr. 11, 2013

(30) Foreign Application Priority Data

Oct. 11, 2011    (JP) .................................. 2011-223905

(51) Int. Cl.
*H01L 21/50*    (2006.01)

(52) U.S. Cl.
USPC ............... 524/438; 524/588; 524/15; 524/31; 524/32; 524/492

(58) Field of Classification Search
USPC ......................................................... 257/712
See application file for complete search history.

(56) References Cited

U.S. PATENT DOCUMENTS 6,984,685 B2    1/2006    Misra et al.
(Continued)

FOREIGN PATENT DOCUMENTS

| EP | 0696630 A2 | 2/1996 |
|---|---|---|
| JP | 7-207160 A | 8/1995 |
| JP | 8-53664 A | 2/1996 |
| JP | 2002-121292 A | 4/2002 |
| JP | 4551074 B2 | 9/2010 |

*Primary Examiner* — Telly Green
*Assistant Examiner* — Damian A Hillman
(74) *Attorney, Agent, or Firm* — Birch, Stewart, Kolasch & Birch, LLP

(57) ABSTRACT

A curable organopolysiloxane composition in grease or paste form, which including:
(A) an organopolysiloxane having at least two alkenyl groups bonded to silicon atom in one molecule;
(B) an organohydrogenpolysiloxane having at least two hydrogen atoms bonded to silicone atom in the molecule;
(C) gallium and/or a gallium alloy having a melting point of 0 to 70° C.;
(D) a thermally conductive filler having an average particle size of 0.1 to 100 μm;
(E) a platinum-based catalyst; and
(F) a polysiloxane of the following general formula (1):

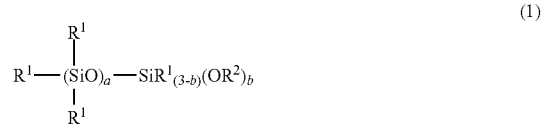

wherein $R^1$ may be the same or different and represents a monovalent hydrocarbon group, $R^2$ represents an alkyl group, an alkoxyl group, an alkenyl group or an acyl group, a is an integer of 5 to 100, and b is an integer of 1 to 3.

7 Claims, 1 Drawing Sheet

(56) References Cited

U.S. PATENT DOCUMENTS

| | | | |
|---|---|---|---|
| 7,141,273 B2 * | 11/2006 | Endo et al. | 427/387 |
| 8,093,331 B2 * | 1/2012 | Fukui | 524/588 |
| 2010/0006798 A1 * | 1/2010 | Endo | 252/78.3 |

* cited by examiner

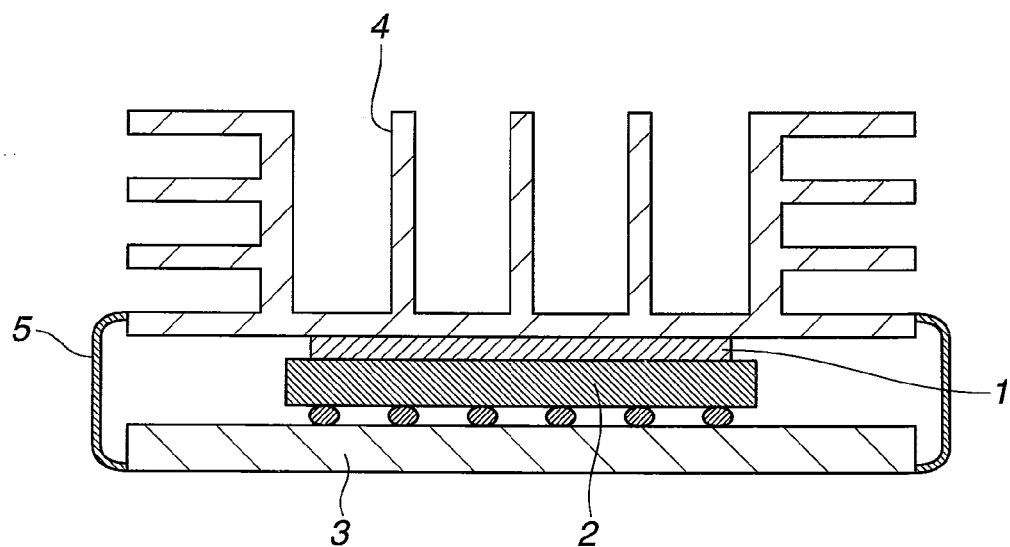

CURABLE ORGANOPOLYSILOXANE COMPOSITION AND SEMICONDUCTOR DEVICE

CROSS-REFERENCE TO RELATED APPLICATION

This non-provisional application claims priority under 35 U.S.C. §119(a) on Patent Application No. 2011-223905 filed in Japan on Oct. 11, 2011, the entire contents of which are hereby incorporated by reference.

TECHNICAL FIELD

This invention relates to a curable organopolysiloxane composition, its preparation method, a cured product thereof, the use of the cured product as a thermally conductive layer, a semiconductor device having the thermally conductive layer, and a method for fabricating the semiconductor device.

BACKGROUND ART

Heat generating electronic parts mounted on printed circuit boards, e.g. an IC (Integrated Circuit) package such as of CPU (Central Processing Unit), may lower in their performance or may break down when the temperature rises owing to the generation of heat in use. To avoid this, the usual practice is to place a thermally conductive sheet of good thermal conductivity between the IC package and a heat radiating member having a radiation fin or to apply a thermally conductive grease therebetween. Eventually, the heat generated in the IC package is efficiently delivered to the heat radiating member and thus radiated. However, the amount of heat generation tends to be increasing in association with a higher performance of electronic parts. Thus, there is a demand of development of materials and members whose thermal conductivity is better than hitherto known counterparts.

Existing thermally conductive sheets are advantageous from the standpoint of working and making processes in that they can be readily mounted. Thermally conductive greases are also advantageous in that CPU, a heat radiating member can be brought into intimate contact with one another without suffering the influence of irregularities on the surfaces of the CPU, heat radiating member and the like while following up the irregularities without leaving a gap therebetween, so that an interfacial heat resistance becomes small. However, both thermally conductive sheet and thermally conductive grease are obtained by formulating thermally conductive fillers so as to impart thermal conductivity thereto. In order not to pose a problem on workability and processability in the course of manufacturing process with the case of thermally conductive sheets, or in order not to cause a problem on workability upon coating such as on heat generating electronic parts by means of a syringe with the case of thermally conductive greases, it is necessary to suppress the upper limit of an apparent viscosity of the grease used to a certain extent. In either case, the ceiling of an amount of a thermally conductive filler to be formulated is limited, with the attendant drawback that a satisfactory thermally conductive effect cannot be obtained.

Under these circumstances, there have been proposed methods of formulating low melting metals in thermally conductive pastes (see Patent Document 1: JP-A H07-207160 and Patent Document 2: JP-A H08-53664), a particulate material that serves to fix and stabilize a liquid metal in a three-phase composite material (see Patent Document 3: JP-A 2002-121292). However, the thermally conductive materials making use of low melting point metals have problems in that they contaminate parts other than the coating part and that when used over a long time, an oily matter is leaked out. In order to solve the above problems, there has been proposed a method of dispersing gallium or a gallium alloy in a curable silicone (see Patent Document 4: JP 4551074). Nevertheless, where a thickness of such a composition is large, satisfactory results cannot be obtained owing to its low thermal conductivity.

CITATION LIST

Patent Document 1: JP-A H07-207160
Patent Document 2: JP-A H08-53664
Patent Document 3: JP-A 2002-121292
Patent Document 4: JP 4551074

SUMMARY OF INVENTION

In view of these background art techniques, it is a primary object of the present invention to provide a curable organopolysiloxane composition wherein a material excellent in thermal conductivity is formulated in a necessary and sufficient amount and the material is uniformly dispersed in a resin matrix in particulate form.

It is another object of the present invention to provide a method for preparing such a curable organopolysiloxane composition as mentioned above.

It is a further object of the present invention to provide the use of the above curable organopolysiloxane composition as a thermally conductive layer that is placed, like existing thermally conductive greases, between a heat generating electronic part and a heat radiating member as following up the surface irregularities of the part or member without causing a gap therebetween and that is made up of a cured product through crosslinkage by heating.

It is a still further object of the present invention to provide a semiconductor device and a method for making the same, wherein a heat generating electronic part and a heat radiating member is bonded together through the above thermally conductive layer, thus being excellent in heat radiation performance.

In order to achieve the above objects, we have made intensive studies and, as a result, found that when low melting gallium and/or gallium alloy, and specific types of alkoxypolysiloxane and thermally conductive filler are selected as a material excellent in thermal conductivity and are formulated in an addition reaction curing-type organopolysiloxane composition, there can be obtained a composition wherein the gallium and/or gallium alloy is uniformly dispersed in particulate form.

It has also been found that in the course of the step of providing a cured product by thermal treatment of the composition, the gallium and/or gallium alloy in liquid form coagulates to form liquid particles having a larger particle size, the liquid particles mutually combine along with the thermally conductive filler to form a sort of pathway made of a series of the combinations, and the pathway structure is fixed and kept in a crosslinked network formed by curing of the resin ingredient.

It has further been found that when the cured product obtained as above is disposed by sandwiching it between a heat generating electronic part and a heat radiating member in layer form, the resulting structure can be used as a thermally conductive layer having a low heat resistance. Furthermore, it has been found that a semiconductor product having excellent heat radiating characteristics can be obtained in which the heat generated upon running of the heat generating electronic part is immediately transmitted to the heat radiating member via the above thermally conductive layer including the gallium and/or gallium alloy fixed and kept in such a structure as set out above. The invention has been accomplished based on the above findings.

According to one embodiment of the present invention, there is provided a curable organopolysiloxane composition in grease or paste form, which including:

(A) 100 parts by weight of an organopolysiloxane having at least two alkenyl groups bonded to silicon atom in one molecule;

(B) an organohydrogenpolysiloxane having at least two hydrogen atoms bonded to silicon atom in the molecule in such an amount that the number of the hydrogen atoms bonded to the silicon atom in component (B) is at 0.1 to 5.0 per one alkenyl group in component (A);

(C) 5,000 to 20,000 parts by weight of gallium and/or a gallium alloy having a melting point of 0 to 70° C.;

(D) 10 to 1,000 parts by weight of a thermally conductive filler having an average particle size of 0.1 to 100 μm;

(E) 0.1 to 500 ppm, relative to the weight of component (A), of a platinum-based catalyst; and (G) 20 to 500 parts by weight of a polysiloxane of the following general formula (1):

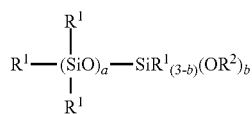

(1)

wherein $R^1$ may be the same or different and represents a monovalent hydrocarbon group, $R^2$ represents an alkyl group, an alkoxyl group, an alkenyl group or an acyl group, a is an integer of 5 to 100, and b is an integer of 1 to 3.

According to another embodiment of the present invention, there is provided a method for preparing the above composition.

According to a further embodiment of the present invention, there is also provided a thermally conductive cured product of the composition.

According to a still further embodiment of the present invention, there is provided use of the thermally conductive cured product as a thermally conductive layer sandwiched between a heat generating electronic part and a heat radiating member.

According to a yet further another embodiment of the present invention, there is provided a semiconductor device having a heat generating electronic part, a heat radiating member and such a thermally conductive layer as mentioned above.

According to another embodiment of the present invention, there is provided a method for making the above-mentioned semiconductor device.

ADVANTAGEOUS EFFECTS OF INVENTION

The curable organopolysiloxane composition of the present invention is in grease or paste form prior to curing and thus, workability in the course of coating onto heat generating electronic parts such as IC packages is good. Accordingly, when a heat radiating member is subjected to pressure bonding to the electronic part, both can be brought into intimate contact with each other while following up the irregularities on the surfaces of the both without creating a gap therebetween. Thus, no interfacial heat resistance occurs.

In the thermal treatment step of curing the resin ingredients through addition reaction, fine liquid particles of gallium and/or its alloy contained in the composition of the present invention coagulate to form larger-sized liquid particles, and the liquid particles are mutually bonded together to form a sort of pathway along with the thermally conductive filler. Thus, the pathway structure is fixed and kept in the three dimensional crosslinked network formed by curing of the resin ingredients, so that the heat generated from the heat generating electronic part can be quickly transmitted to the heat radiating member thereby reliably showing a heat radiating effect higher than with the case of existing thermally conductive sheets or thermally conductive greases. Since the gallium and/or an alloy thereof, which forms the pathways contained in the thermally conductive layer made of the cured product of the composition of the present invention incorporated into a semiconductor device, is fixed and kept in the three dimensional crosslinked network of the cured resin, there is no problem of contamination of other parts or leaking out of an oily matter with time as would be involved in existing thermally conductive greases. Accordingly, reliability of the semiconductor device can be further improved.

BRIEF DESCRIPTION OF DRAWING

FIG. 1 is a longitudinal sectional view schematically showing an example of a semiconductor device, to which a composition of the present invention is applied.

DESCRIPTION OF EMBODIMENTS

[Curable Organopolysiloxane Composition]
(A) Organopolysiloxane

Component (A) of the composition of the present invention is an organopolysiloxane having at least two alkenyl groups bonded to silicon atom in a molecule and is a base resin (base polymer) in the addition reaction curing system of the present invention.

So far as this organopolysiloxane is liquid, its molecular structure is not critical. For instance, mention is made of a linear structure, a branched chain structure or a linear structure having a partial branch, of which a linear structure is preferred.

The alkenyl groups include, for example, a vinyl group, an allyl group, a 1-butenyl group, a 1-hexenyl group and the like. Of these, the vinyl group is preferred because of its versatility. This alkenyl group may be bonded to a silicon atom either at a terminal end or at an intermediate of the molecular chain. Nevertheless, in order to impart good flexibility to the resulting cured product, it is preferred to allow the alkenyl group to be bonded only to a silicon atom at the terminal end of the molecular chain.

The groups bonded to the silicon atom and other than the alkenyl group in component (A) include, for example, an unsubstituted or substituted monovalent hydrocarbon group, for which mention is made of an alkyl group such as a methyl group, an ethyl group, a propyl group, a butyl group, a pentyl group, a hexyl group a heptyl group, an octyl group, a nonyl group, a decyl group, a dodecyl group and the like; a cycloalkyl group such as a cyclopentyl group, a cyclohexyl group and the like; an aryl group such as a phenyl group, a tolyl group, a xylyl group, a naphthyl group and the like; an aralkyl group such as an a benzyl group, a 2-phenylethyl group, a 2-phenylpropyl group and the like; and a halogenated alkyl group such as a chloromethyl group, a 3,3,3-trifluoropropyl group, a 3-chloropropyl group and the like. Of these, it is preferred from the standpoint of synthetic and economic aspects to contain at least 90% of a methyl group.

The viscosity of the organopolysiloxane at 25° C. is generally within a range of 0.05 to 100 Pa·s, preferably 0.5 to 50 Pa·s. If the viscosity is too low, the resulting composition becomes poor in storage stability. Too high a viscosity may worsen the spreadability of the resulting composition. It will be noted that the viscosity can be measured by use of spiral viscometer PC-ITL (made by Malcom Co., Ltd.).

Preferred examples of the organopolysiloxane include polydimethylsiloxane blocked with a dimethylvinylsiloxy group at both ends of the molecular chain, polydimethylsiloxane blocked with a methyldivinylsiloxy group at both ends of the molecular chain, dimethylsiloxane/methylphenylsiloxane copolymer blocked with a dimethylvinylsiloxy group at both ends of the molecular chain, and the like.

The organopolysiloxanes of component (A) may be used singly or in combination, for example, of at least two having different viscosities.

(B) Organohydrogenpolysiloxane

Component (B) of the composition of the present invention is an organohydrogenpolysiloxane having at least two hydrogen atoms bonded to silicon atom (hereinafter referred to as "SiH group") in a molecule and serves as a crosslinking agent for component (A). More particularly, the SiH group in component (B) is added by reaction with the hydrosilylation reaction with the alkenyl group in component (A) by the action of a platinum-based catalyst of component (E) described hereinafter thereby providing a crosslinked cured product having a three dimensional network structure having crosslinkage.

The group bonded to silicon atom and other than the hydrogen atom in component (B) includes, for example, an unsubstituted or substituted monovalent hydrocarbon group other than the alkenyl group and such groups as exemplified with respect to component (A) can be mentioned. Of these, a methyl group is preferred from the standpoint of synthetic and economic aspects.

The structure of the organohydrogenpolysiloxane may be linear, branched or cyclic.

Preferred examples of the organohydrogenpolysiloxane of component (B) include methylhydrogenpolysiloxane blocked with a trimethylsiloxy group at both ends of the molecular chain, dimethylsiloxane/methylhdyrogensiloxane copolymer blocked with a trimethylsiloxy group at both ends of the molecular chain, dimethylsiloxane/methylhdyrogensiloxane/methylphenylsiloxane copolymer blocked with a trimethylsiloxy group at both ends of the molecular chain, dimethylpolysiloxane blocked with a dimethylhydrogensiloxy group at both ends of the molecular chain, dimethylpolysiloxane/methylhydrogensiloxane copolymer blocked with a dimethylhydrogensiloxy group at both ends of the molecular chain, dimethylsiloxane/methylphenylsiloxane copolymer blocked with a dimethylhydrogensiloxy group at both ends of the molecular chain, methylphenylpolysiloxane blocked with a dimethylhydrogensiloxy group at both ends of the molecular chain, and the like. The organohydrogenpolysiloxanes of component (B) may be used singly or in combination of at least two.

The amount of component (B) is such that the number of the hydrogen atoms boned to silicon atom in component (B) is at 0.1 to 5.0, preferably at 0.5 to 3.0, per one alkenyl group in component (A). If the number is less than 0.1, a satisfactory network structure is not formed, so that a required hardness after curing cannot be obtained and a difficulty is involved in fixing and keeping component (C) described hereinafter. On the other hand, when the number exceeds 5.0, the physical properties of the resulting cured product greatly change with time, with the possibility of leading to worsening of storage stability.

(C) Gallium and/or its Alloy

Component (C) of the composition of the present invention is gallium and/or its alloy having a melting point of 0 to 70° C. Component (C) is formulated so as to impart good thermal conductivity to a cured product obtained from the composition of the present invention. The formulation of component (C) becomes a prominent feature of the present invention.

The melting point of component (C) should be within a range of 0 to 70° C. as mentioned above. In order to keep a dispersed state of individual ingredients contained in the composition after preparation of the composition of the present invention, the composition has to be kept under low temperature conditions of about −30 to −10° C., preferably −25 to −15° C., during long-term storage and transportation. If the melting point is lower than 0° C., liquid fine particles are apt to coagulate when subjected to long-term storage and transportation, making it relatively difficult to keep the composition under initial preparation conditions. On the other hand, when the melting point exceeds 70° C., quick melting is not allowed in the composition preparing process, resulting in poor workability. Thus, the range of 0 to 70° C. as defined above is a requirement necessary from the standpoint of handling and is proper in the practice of the present invention. Especially, it is more preferred to use the ingredient having a melting point within a range of 15 to 50° C. This is because of the ease in preparing the composition of the present invention, simplicity in handling during long-term storage and transportation and ease in the formation of thermally conductive pathways ascribed to the coagulation and linking of the liquid fine particles of component (C) under thermal treatment conditions for curing the composition.

Metallic gallium has a melting point of 29.8° C. Typical gallium alloys include, for example, gallium-indium alloy, e.g. Ga—In (ratio by weight=75.4:24.6 and melting point=15.7° C.), gallium-tin alloy, gallium-tin-zinc alloy, e.g. Ga—Sn—Zn (ratios by weight=82:12:6 and melting point=17° C.), gallium-indium-tin alloy, e.g. Ga—In—Sn (ratios by weight=21.5:16.0:62.5 and melting point=10.7° C.), gallium-indium-bismuth-tin alloy, e.g. Ga—In—Bi—Sn (ratios by weight=9.4:47.3:24.7:18.6 and melting point=48.0° C.) and the like.

Component (C) may be used singly or in combination of at least two.

The liquid fine particles or solid fine particles present in an uncured composition of the present invention are substantially spherical in shape and may contain those particles of an indeterminate form. The average particle size is generally at 0.1 to 100 μm, preferably at 5 to 50 μm. If the average particle size is too small, the resulting composition becomes too high in viscosity and becomes poor in spreadability, thus presenting a problem on coating operations. On the other hand, when the average particle size is too large, the composition becomes inhomogeneous, making it difficult to coat onto heat generating electronic parts in the form of a thin film. It will be noted that the above-mentioned shape and average particle size, and the dispersion state in the composition can be kept before the coating step on heat generating electronic parts since the composition is stored under low temperature conditions immediately after its preparation as set out above. The average particle size can be measured by use of Microtrac MT3300EX (made by Nikkiso CO., Ltd.).

The amount of component (C) is within a range of 5,000 to 20,000 parts by weight, preferably 7,000 to 15,000 parts by weight, per 100 parts by weight of component (A). If the amount is less than 5,000 parts by weight, thermal conductivity becomes low and thus, a satisfactory heat radiation performance cannot be obtained when the composition is coated thick. Over 20,000 parts by weight, it is difficult to provide a uniform composition and the resulting composition becomes too high in viscosity, with the attendant problem that there cannot be obtained such a composition in the form of a spreadable grease.

(D) Thermally Conductive Filler

The composition of the present invention should be formulated, along with the above component (C), with a thermally conductive filler (D) as formulated in hitherto known thermally conductive sheets or thermally conductive greases.

If the amount of component (D) is less than 10 parts by weight, gallium and/or its alloy is not uniformly dispersed in the mixture of components (A) and (G). Over 1,000 parts by weight, a problem is involved in that the resulting composition becomes high in viscosity and there cannot be obtained a composition in the form of a spreadable grease. The amount is within a range of 10 to 1,000 parts by weight, preferably 50 to 500 parts by weight.

Component (D) is not critical in type so far as it exhibits good thermal conductivity, and all of hitherto known ones may be usable and include, for example, aluminum powder, zinc oxide powder, alumina powder, born nitride powder, aluminum nitride powder, silicon nitride powder, copper powder, diamond powder, nickel powder, zinc powder, stainless steel powder, carbon powder and the like. These ingredients (D) may be used singly or in combination of at least two.

In this regard, however, when those powders, such as of aluminum, having high reactivity with gallium are used, coagulation may take place in the course of formulation and kneading for preparation of the composition, resulting in a difficulty in uniform formulation. In this case, the uniform dispersion of liquid fine particles of component (C) in a mixed solution of components (A) and (G) is initially finished so as to cover component (C) with the mixed solution of components (A) and (G), followed by addition of component (D) and kneading. This prevents component (D) from coagulation.

The average particle size of component (D) is generally within a range of 0.1 to 100 μm, preferably 1 to 20 μm. If the average particle size is too small, the resulting composition becomes too high in viscosity, thus leading to poor spreadability. In contrast, if the size becomes too large, it is difficult to obtain a uniform composition. It will be noted that the average particle size can be measured by Mircotrac MT3300EX (made by Nikkiso Co., Ltd.).

(E) Platinum-Based Catalyst

The platinum-based catalyst of component (E) of the composition of the present invention is an ingredient that is formulated to facilitate the addition reaction between the alkenyl group in component (A) and the SiH in component (B) thereby providing a crosslinked cured product in the form of a three dimensional network from the composition of the present invention.

As component (E), there may be used all the known ones ordinarily employed in the hydrosilylation reaction and mention is made, for example, of metallic platinum (platinum black), chloroplatinic acid, platinum-olefin complexes, platinum-alcohol complexes, platinum coordination compounds and the like. Component (E) may be used in an effective amount necessary for curing the composition of the present invention and is not critical. For instance, the amount is generally at about 0.1 to 500 ppm of platinum atom relative to component (A) on weight basis.

(F) Addition Reaction Control Agent

The addition reaction control agent of component (F) of the composition of the present invention is an ingredient to be formulated, if necessary. This ingredient is formulated so as to control the hydrosilylation reaction while acting on the platinum-based catalyst at room temperature and ensure a working life (e.g. a shelf life or pot life) of the composition of the present invention as not impeding operations of coating such as onto heat generating electronic parts and the like.

For component (F), there may be used all the known addition reaction control agents used in ordinary addition reaction curable silicone compositions and specific mention is made, for example, of acetylene compounds such as 1-ethynyl-1-cyclohexanol, 3-butyn-1-ol and the like, various types of nitrogen compounds, organophosphorus compound, oxime compounds, organochloro compounds and the like.

The amount of component (F) differs depending on the amount of component (E) and cannot be definitely determined. That is, such an amount may be an effective amount sufficient to suppress the progress of the hydrosilylation reaction and is not thus specifically limited. For example, an amount of about 0.001 to 5 parts by weight per 100 parts by weight of component (A) is generally used. If the amount of component (F) is too small, a satisfactory working life cannot be secured. On the other hand, when the amount is too large, curability of the composition of the present invention may lower. It will be noted that in order to improve the dispersability of component (F) in the composition, there may be allowed its use after dilution with an organic solvent such toluene, xylene, isopropyl alcohol or the like, if necessary.

(G) Surface Treating Agent

For the purposes of hydrophobizing gallium and/or its alloy of component (C), improving the wettability of the liquid particles of component (C) with the organopolysiloxane of component (A) and uniformly dispersing component (C) as fine particles in the matrix made of component (A), a polysiloxane represented by the following general formula (1) is formulated as a surface treatment agent (G).

Component (G) also has a function of improving the surface wettability of the thermally conductive filler of component (D) thereby ensuring good uniform dispersability.

Component (G) is a polysiloxane of the following general formula (1) blocked with a hydrolyzable group at one end of the molecular chain and having a dynamic viscosity of 10 to 10,000 mm²/second at 25° C.:

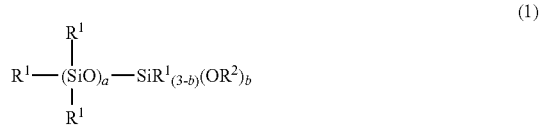

wherein $R^1$ may be the same or different and represents a monovalent hydrocarbon group, $R^2$ represents an alkyl group, an alkoxyl group, an alkenyl group or an acyl group, a is an integer of 5 to 100 and b is an integer of 1 to 3. The dynamic viscosity can be measured by means of an Ostwalt viscometer.

If the amount is less than 20 parts by weight, components (C) and (D) are not satisfactorily dispersed and a uniform grease composition cannot be obtained. Over 500 parts by weight, component (A) becomes relatively small in amount, with the attendant problem that the composition to be finished is unlikely to be cured. If not cured, the grease moves after coated onto an IC package, with the possibility that the performance is significantly degraded. Accordingly, the amount of component (G) is within a range of 20 to 500 parts by weight, preferably from 50 to 200 parts by weight.

Further, in some cases, an alkoxysilane of the following general formula (2) as component (G-2) may be formulated as part of component (G):

$$R^3_c R^4_d Si(OR^5)_{4-c-d} \quad (2)$$

wherein $R^3$ independently represents an alkyl group having 6 to 15 carbon atoms, $R^4$ independently represents an unsubstituted or substituted hydrocarbon group having 1 to 8 carbon atoms, $R^5$ independently represents an alkyl group having 1 to 6 carbon atoms, c is an integer of 1 to 3 and d is an integer of 0 to 2, provided that the sum of c+d is an integer of 1 to 3.

As $R^3$ in the formula, mention is made, for example, of a hexyl group, an octyl group, a nonyl group, a decyl group, a dodecyl group, a tetradecyl group and the like. If the number of carbon atoms is less than 6, an improvement in wettability of components (C) and (D) is not satisfactory. Over 15, the organosilane of component (G-2) becomes solidified at a normal temperature, so that handling becomes inconvenient and the low temperature characteristics of the resulting composition lower.

As $R^4$, mention is made for example, of an alkyl group such as a methyl group, an ethyl group, a propyl group, a hexyl group, an octyl group or the like; a cycloalkyl group such as a cyclopentyl group, a cyclohexyl group or the like; an alkenyl group such as a vinyl group, an allyl group or the like; an aryl group such as a phenyl group, a tolyl group or the like; an aralkyl group such as a 2-phenylethyl group, a 2-methyl-2-phenylethyl group or the like; a halogenated hydrocarbon group such as a 3,3,3-trifluoropropyl group, a 2-(nanofluorobutyl)ethyl group, a 2-(heptadecafluorooctyl)-ethyl group, a p-chlorophenyl group or the like. Of these, a methyl group and an ethyl group are preferred.

As $R^5$, mention is made, for example, of an alkyl group such as a methyl group, an ethyl group, a propyl group, a butyl group, a pentyl group, a hexyl group or the like. Of these, a methyl group and an ethyl group are preferred.

Preferred examples of component (G-2) include those indicated below: $C_6H_{13}Si(OCH_3)_3$, $C_{10}H_{21}Si(OCH_3)_3$, $C_{12}H_{25}Si(OCH_3)_3$, $C_{12}H_{25}Si(OC_2H_5)_3$, $C_{10}H_{21}Si(CH_3)(OCH_3)_2$, $C_{10}H_{21}Si(C_6H_5)(OCH_3)_2$, $C_{10}H_{21}Si(CH_3)(OC_2H_5)_2$, $C_{10}H_{21}Si(CH=CH_2)(OCH_3)_2$, and $C_{10}H_{21}Si(CH_2CH_2CF_3)(OCH_3)_2$.

It will be noted that component (G-2) may be used singly or in combination of at least two. The amount is at 0.1 to 100 parts by weight, preferably at 1 to 50 parts by weight, per 100 parts by weight of component (A). If the amount is too large, the wetting effect does not correspondingly increase, thus being uneconomical. This ingredient is, more or less, volatile and if it is allowed to stand in open air, the composition of the present invention may gradually become hardened.

Other Formulation Ingredients

Aside from the above ingredients, the composition of the present invention may be further formulated with an organopolysiloxane of the following average compositional formula (3) within a range of amount not impeding the purpose and effect of the present invention:

$$R^6_e SiO_{(4-e)/2} \quad (3)$$

wherein $R^6$ independently represents an unsubstituted or substituted monovalent hydrocarbon group that is free of an aliphatic unsaturated bond and has 1 to 18 carbon atoms and e is a number of 1.8 to 2.2. The organopolysiloxanes have a dynamic viscosity of 10 to 100,000 mm²/second at 25° C. and may be used singly or in combination of at least two.

As defined above, $R^6$ is independently an unsubstituted or substituted monovalent hydrocarbon group having 1 to 18 carbon atoms. As $R^6$, mention is made, for example, of an alkyl group such as a methyl group, an ethyl group, a propyl group, a hexyl group, an octyl group, a decyl group, a dodecyl group, a tetradecyl group, a hexadecyl group, an octadecyl group or the like; a cycloalkyl group such as a cyclopentyl group, a cyclohexyl group or the like; an alkenyl group such as a vinyl group, an allyl group or the like; an aryl group such as a phenyl group, a tolyl group or the like; an aralkyl group such as a 2-phenylethyl group, a 2-methyl-2-phenylethyl group or the like; a halogenated hydrocarbon group such as a 3,3,3-trifluoropropyl group, a 2-(perfluorobutyl)ethyl group, a 2-(perfluorooctyl)ethyl group, a p-chlorophenyl group or the like.

Further, there may be formulated, for example, heat-resistance improvers such as iron oxide, cerium oxide and the like, viscosity adjusting agents such as silica and the like, and colorants.

Viscosity of the Composition

As will be described later, the composition of the present invention is applied onto the surface of heat generating electronic parts, to which a heat radiating member is bonded under pressure and cured by heat treatment to form a thermally conductive layer. In order to ensure good workability, the composition of the present invention should be in the form of a grease.

For example, the composition of the present invention is accommodated in a syringe and is coated onto the surface of a heat generating electronic part, such as CPU, from the syringe to form a coating layer, to which a heat radiating member is pressure-bonded. Accordingly, the viscosity of the composition of the present invention is generally at 10 to 1,000 Pa·s, preferably at 50 to 400 Pa·s. If the viscosity is too low, dripping may take place upon coating, with the possibility of causing a working problem. On the other hand, when the viscosity is too large, a difficulty is involved in pushing it out from the syringe, with some cases that its coating efficiency becomes worsened. It will be noted that the viscosity can be measured by means of spiral viscometer PC-ITL (made by Malcom Co., Ltd.).

[Preparation of Inventive Composition]

The curable organopolysiloxane composition of the present invention can be obtained by a fabrication method, which including the steps of:

(i) obtaining a uniform mixture by kneading the afore-indicated components (A), (C), (D), (G) and, if required, (G-2) at a temperature within a range of 40 to 120° C. and above the melting point of component (C);

(ii) stopping the kneading and cooling the mixture down to a level lower than the melting point of component (C); and (iii) adding the afore-indicated components (B), (E) and (F) and other ingredients, if necessary, and kneading the resulting mixture at a temperature lower than the melting point of component (C) to obtain a uniform mixture.

In the above preparation method, there is used an agitating or kneading machine such as a conditioning mixer, a planetary mixer or the like, which is equipped with heating means and, if necessary, cooling means.

In the above step (i), gallium and/or its alloy in liquid form of component (C) and a thermally conductive filler of component (D) are uniformly dispersed in a mixed solution of components (A) and (G) or in a mixed solution of components (A), (G) and (G-2).

The temperature decreasing and cooling operations in the step (ii) should preferably be carried out quickly. In the step (ii), component (C) in the form of liquid fine particles uniformly dispersed in the matrix made of the mixed solution of components (A) and (G) or components (A), (G) and (G-2) is solidified while keeping the average particle size thereof and the dispersed state.

The step (iii) is preferably completed within a time as short as possible. At the time of completion of the step (iii), substantially no change occurs with respect to the dispersed state of the solidified fine particles of component (C). After the completion of the step (iii), it is preferred that the resulting composition is put into a container and is immediately stored in a freezer or freezing chamber at a temperature of about −30 to −10° C., preferably −25 to −15° C. In the course of transportation, it is preferred to use vehicles provided with a freezing equipment. If the composition of the present invention is stored or transported under such low temperature conditions, its formulation and dispersed state can be stably kept even if it is stored over a long time, for example.

[Application to Semiconductor Devices]

The curing of the composition of the present invention can be performed by keeping it at a temperature of 80 to 180° C. for about 30 to 240 minutes.

The cured product of the composition of the present invention can be used as a thermally conductive product for forming a thermally conductive layer interposed between a heat generating electronic part and a heat radiating member.

In this case, there can be obtained a semiconductor device having excellent heat radiating characteristics by use of the inventive composition, i.e. a semiconductor device including a heat generating electronic part, a heat radiating member and a thermally conductive layer made of the cured product of the composition of the present invention wherein the heat generating electronic part and the heat radiating member are bonded via the thermally conductive layer.

This semiconductor device can be obtained by a fabrication method, which including the steps of:

(a) coating the composition onto a surface of a heat generating electronic part to form, on the surface, a coating layer made of the composition;

(b) subjecting the heat radiating member to pressure bonding to and fixing on the coating layer; and (c) treating the resulting structure at 80 to 180° C. to cure the coating layer thereby providing a thermally conductive layer.

The semiconductor device and its fabrication method are illustrated with reference to FIG. 1. It will be noted that the device illustrated in FIG. 1 is merely an instance of application of the composition of the present invention to a semiconductor device and should not be construed as limiting the present invention thereto.

Initially, the composition of the present invention in cryogenically-preserved state is naturally thawed to provide a grease. Next, the composition of the present invention in liquid form is accommodated in a coating tool such as a syringe.

The composition of the present invention is dispensed, such as with a syringe, on a surface of a heat generating electronic part, e.g. an IC package 2 such as CPU, which is a heat generating electronic part mounted on a printed circuit board 3 shown in FIG. 1 to form a coating layer 1. A heat radiating member, e.g. a heat radiating member 4 usually having an aluminum heat radiating fin, is disposed and fixed thereon by pressure bonding of the heat radiating member 4 to the IC package 2 via the coating layer 1 by use of a clamp 5.

At this stage, it is preferred to adjust or select the clamp 5 in such a way that the thickness of the coating layer 1 sandwiched between the IC package 2 and the heat radiating member 4 is generally at 5 to 100 μm, preferably at 30 to 70 μm. If the thickness is too small, the follow-up capability of the composition of the present invention to the IC package 2 and the heat radiating member 4 becomes unsatisfactory in the course of the pressure bonding, with concern that an interspace therebetween is formed. On the other hand, too large a thickness leads to a great heat resistance, so that a satisfactory heat radiating effect cannot be expected.

Next, the device configured in a way as set out above is passed through a heating apparatus such as a reflow furnace or the like to cure the coating layer 1 made of the composition of the present invention, thereby forming a thermally conductive layer. The temperature conditions required for the curing include 80 to 180° C., preferably 100 to 150° C. If the temperature is lower than 80° C., insufficient curing results. On the other hand, with high temperatures exceeding 180° C., there is concern that the electronic part and a base material may degrade.

In the course of raising the temperature to curing temperature conditions, the liquid fine particles of gallium and/or its alloy of component (C) in the composition of the present invention mutually coagulate to form larger-sized liquid particles and simultaneously to form a sort of pathway made of a series of combinations with component (D).

Further, the liquid particles of component (C) fuse on the surfaces of the contacting IC package 2 and the heat radiating member 4. Thus, the IC package 2 and the heat radiating member 4 are substantially integrally connected in series via the sort of pathway wherein the liquid particles of component (C) and the thermally conductive filler of component (D) are combined in series and thus, become a much thermally conductive mass. The pathway-like structure is fixed and kept in the three-dimensionally crosslinked network of the cured product formed by addition reaction between components (A) and (B).

In case where the semiconductor device obtained in this way is activated for use, the surface temperature of the heat generating electronic part such as an IC package usually arrives at a level as high as about 60 to 120° C. To cope with this generation of heat, the thermally conductive layer made of the cured product of the composition of the present invention is used as showing such high thermal conductivity as set out above. Accordingly, such a feature and effect can be obtained that the heat radiating characteristics are much more excellent than those attained by existing thermally conductive sheets and thermally conductive greases. After long-time continuous operations and use of the semiconductor device, the gallium and/or its alloy of component (C), included in the thermally conductive layer and forming the pathway, is fixed and kept in the three dimensionally crosslinked network of the cured product and thus, does not leak out from the thermally conductive layer.

Further, the thermally conductive layer has tackiness and has stable flexibility in case where the heat radiating member goes out of alignment or in long-term use, thus not permitting the thermally conductive layer to be peeled off from the heat generating electronic part and the heat radiating member.

It will be noted that similar results are obtained when a cured product sheet of a desired thickness is preliminarily formed from the composition of the present invention and interposed between a heat generating electronic part and a heat radiating member like existing thermally conductive sheets. Besides, the sheet of the cured product of the composition of the present invention may be appropriately used as a part of other types of devices, for which thermal conductivity and heat resistance are needed.

EXAMPLES

The invention is described in more detail by way of Examples, which should not be construed as limiting the present invention thereto.

Components (A) to (G) used in the following Examples and Comparative Examples are indicated below.
Component (A):
Dimethylpolysiloxanes having viscosities at 25° C. indicated below and blocked with a dimethylvinylsilyl group at opposite ends thereof:
Viscosity of (A-1)=0.6 Pa·s;
Viscosity of (A-2)=10.0 Pa·s; and
Viscosity of (A-3)=30.0 Pa·s.
Component (B):
(B-1) Organohydrogenpolysiloxane represented by the following structural formula.

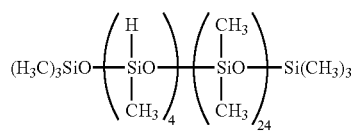

Component (C):
(C-1) Metallic gallium (melting point=29.8° C.)
(C-2) Ga—In alloy (ratio by weight=75.4:24.6 and melting point=15.7° C.)
(C-3) Ga—In—Bi—Sn alloy (ratios by weight=9.4:47.3:24.7:18.6 and melting point=48.0° C.)
(C-4) Metallic indium (melting point=156.2° C.) (for comparison)
Component (D):
(D-1) Alumina powder (average particle size=8.2 μm)
(D-2) Zinc oxide powder (average particle size=1.0 μm)
(D-3) Copper powder (average particle size=110.2 μm) (for comparison)
Component (E):
(E-1) Dimethylpolysiloxane (blocked with a dimethylvinylsilyl group at opposite ends thereof and having a viscosity of 0.6 Pa·s) solution of platinum-divinyltetramethyldisoloxane complex (platinum atom content=1 wt %)
Component (F):
(F-1) 50 wt % toluene solution of 1-ethynyl-1-cyclohexanol
Component (G):
(G-1) Dimethylpolysiloxane blocked with a trimethoxysilyl group at one end thereof, represented by the following structural formula, and having a viscosity of 32 mm²/second

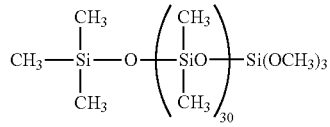

(G-2) Organosilane represented by $C_{12}H_{25}Si(OC_2H_5)_3$

Examples 1 to 6 and Comparative Examples 1 to 8

Preparation of Compositions

Compositions were prepared in the following way using formulations and amounts, indicated in Tables 1 to 3, of the respective ingredients.
Components (A), (C), (D) and (G) were added to a conditioning mixer (available under the commercial name of "Awatorirentaro," made by Thinky Corporation) having an inner capacity of 250 ml, followed by raising the temperature to 70° C., keeping this temperature and kneading for five minutes. Next, the kneading was stopped, followed by cooling down to 15° C.
Subsequently, components (B), (E) and (F) were further added and kneaded so that they became uniform while keeping the respective temperatures to prepare the compositions.
Preparation of Cured Products
The thus obtained compositions (except for Comparative Examples 2 to 8) were each coated onto the whole surface of a standard aluminum plate, on which another standard aluminum plate was superposed so that the thickness of the composition was adjusted to within a range of 50 to 70 μm by use of a micrometer (M820-25VA, made by Mitutoyo Corporation). Next, the temperature was raised to 125° C. in an electric furnace and held at the temperature for one hour to cure the respective compositions, followed by allowing to stand and cool down to room temperature thereby preparing samples for heat resistance measurement.
The thus prepared samples were again subjected to measurement of thickness (by use of the above-indicated micrometer), from which the known thicknesses of the standard aluminum plates were subtracted to determine a thickness of the respective cured compositions.
Measurement of Viscosity
The absolute viscosity of the compositions was measured by use of PC-ITL (10 rpm), made by Malcom Co., Ltd.
Measurement of Heat Resistance
Using the respective samples, the heat resistance (mm²-K/W) of each cured composition was measured by means of a heat resistance measuring instrument (Microflash, made by Holometrix, Inc.).
Measurement of Thermal Conductivity
The thermal conductivity was measured at 25° C. in all cases by means of TPA-501, made by Kyoto Electronics Manufacturing Co., Ltd.
Measurement of Particle Size
The particle size of thermally conductive fillers was measured by means of Microtrac MT3300EX, as a particle size analyzer, made by Nikkiso Co., Ltd., as a cumulative average size on volumetric basis.
Application to Semiconductor Device
0.2 g of the respective compositions obtained in Examples 1 to 6 was coated onto a surface of 2 cm×2 cm CPU to form a coating layer. A heat radiating member was placed on the coating layer, followed by curing to obtain a semiconductor device having the CPU and the heat radiating member bonded through the resulting 30 to 70 μm thick thermally conductive layer. The respective devices were each assembled in a host computer, a personal computer and the like and run, revealing that although the heat generating temperature of the CPU was at about 100° C., all the devices enabled stable thermal conduction and heat radiation over a long time thereby preventing the performance lowering and breakage of CPU ascribed to the accumulation of overheating. Accordingly, it was confirmed when adopting the cured products of the compositions of the present invention, the reliability of the semiconductor devices was improved.

TABLE 1

| | | | Example | | | | | |
|---|---|---|---|---|---|---|---|---|
| | | | 1 | 2 | 3 | 4 | 5 | 6 |
| Compo- | (A) | A-1 | | | | 100 | | |
| sition | | A-2 | | | 100 | | | |
| (parts by | | A-3 | 100 | 100 | | | 100 | 100 |

TABLE 1-continued

|  |  |  | Example |  |  |  |  |  |
|---|---|---|---|---|---|---|---|---|
|  |  |  | 1 | 2 | 3 | 4 | 5 | 6 |
| weight) | (B) | B-1 | 3.7 | 3.7 | 8.2 | 4.3 | 4.6 | 5.2 |
|  |  | SiH/Vi* | 1.8 | 1.8 | 1.0 | 1.5 | 2.2 | 2.5 |
|  | (C) | C-1 | 9,000 | 9,000 | 12,000 | 15,000 |  |  |
|  |  | C-2 |  |  |  |  | 9,000 |  |
|  |  | C-3 |  |  |  |  |  | 9,000 |
|  | (D) | D-1 | 100 | 100 | 200 | 300 | 100 | 100 |
|  |  | D-2 |  |  |  | 50 |  |  |
|  | (E) | E-1 | 0.3 | 0.3 | 0.3 | 0.3 | 0.3 | 0.3 |
|  | (F) | F-1 | 0.3 | 0.3 | 0.3 | 0.3 | 0.3 | 0.3 |
|  | (G) | G-1 | 100 | 100 | 150 | 200 | 100 | 100 |
|  |  | G-2 |  | 16 |  |  |  | 40 |
| Viscosity (Pa · s) |  |  | 220 | 201 | 290 | 350 | 230 | 242 |
| Thickness of composition layer (μm) |  |  | 55 | 52 | 60 | 68 | 54 | 53 |
| Thermal conductivity (W/mK) |  |  | 7.3 | 7.0 | 7.5 | 8.5 | 7.2 | 7.5 |
| Heat resistance (mm²-K/W) |  |  | 4.6 | 4.7 | 4.9 | 4.9 | 4.7 | 4.2 |

*SiH/Vi = the number of SiH groups in component (B) per one vinyl group in component (A) (herein and whenever it appears hereinafter)

TABLE 2

|  |  |  | Comparative Example |  |  |  |  |  |
|---|---|---|---|---|---|---|---|---|
|  |  |  | 1 | 2 | 3 | 4 | 5 | 6 |
| Composition (parts by weight) | (A) | A-1 |  |  |  |  |  |  |
|  |  | A-2 |  |  |  |  |  |  |
|  |  | A-3 | 100 | 100 | 100 | 100 | 100 | 100 |
|  | (B) | B-1 | 3.7 | 3.7 | 3.7 | 3.7 | 3.7 | 3.7 |
|  |  | SiH/Vi* | 1.8 | 1.8 | 1.8 | 1.8 | 1.8 | 1.8 |
|  | (C) | C-1 | 2,000 | 25,000 | 9,000 | 9,000 | 9,000 | 9,000 |
|  |  | C-2 |  |  |  |  |  |  |
|  |  | C-3 |  |  |  |  |  |  |
|  |  | C-4 |  |  |  |  |  |  |
|  | (D) | D-1 | 100 | 100 | 1,500 |  | 100 | 100 |
|  |  | D-2 |  |  |  |  |  |  |
|  |  | D-3 |  |  |  |  |  |  |
|  | (E) | E-1 | 0.3 | 0.3 | 0.3 | 0.3 | 0.3 | 0.3 |
|  | (F) | F-1 | 0.3 | 0.3 | 0.3 | 0.3 | 0.3 | 0.3 |
|  | (G) | G-1 | 100 | 100 | 100 | 100 | 10 | 700 |
|  |  | G-2 |  |  |  |  |  |  |
| Viscosity (Pa · s) |  |  | 250 | A uniform grease composition could not be obtained | A uniform grease composition could not be obtained | A uniform grease composition could not be obtained | A uniform grease composition could not be obtained | No cured product obtained |
| Thickness of composition layer (μm) |  |  | 66 | — | — | — | — | — |
| Thermal conductivity (W/mK) |  |  | 1.5 | — | — | — | — | — |
| Heat resistance (mm²-K/W) |  |  | 30 | — | — | — | — | — |

TABLE 3

|  |  |  | Comparative Example |  |
|---|---|---|---|---|
|  |  |  | 7 | 8 |
| Composition (parts by weight) | (A) | A-1 |  |  |
|  |  | A-2 |  |  |
|  |  | A-3 | 100 | 100 |
|  | (B) | B-1 | 3.7 | 3.7 |
|  |  | SiH/Vi* | 1.8 | 1.8 |
|  | (C) | C-1 |  | 9,000 |
|  |  | C-2 |  |  |
|  |  | C-3 |  |  |
|  |  | C-4 | 9,000 |  |
|  | (D) | D-1 | 100 |  |
|  |  | D-2 |  |  |
|  |  | D-3 |  | 100 |
|  | (E) | E-1 | 0.3 | 0.3 |
|  | (F) | F-1 | 0.3 | 0.3 |
|  | (G) | G-1 | 100 | 100 |
|  |  | G-2 |  |  |
| Viscosity (Pa · s) |  |  | A uniform grease composition could not be obtained | A uniform grease composition could not be obtained |
| Thickness of composition layer (μm) |  |  | — | — |
| Thermal conductivity (W/mK) |  |  | — | — |
| Heat resistance (mm² – K/W) |  |  | — | — |

Japanese Patent Application No. 2011-223905 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A curable organopolysiloxane composition in grease or paste form, comprising:
   (A) 100 parts by weight of an organopolysiloxane having at least two alkenyl groups bonded to silicon atom in one molecule;
   (B) an organohydrogenpolysiloxane having at least two hydrogen atoms bonded to silicone atom in the molecule in such an amount that the number of the hydrogen atoms bonded to the silicon atom in component (B) is at 0.1 to 5.0 per one alkenyl group in component (A);

(C) 7,000 to 20,000 parts by weight of gallium and/or a gallium alloy having a melting point of 0 to 70° C.;

(D) 10 to 1,000 parts by weight of a thermally conductive filler having an average particle size of 0.1 to 100 μm;

(E) 0.1 to 500 ppm, relative to the weight of component (A), of a platinum-based catalyst; and (G) 20 to 500 parts by weight of a polysiloxane of the following general formula (1):

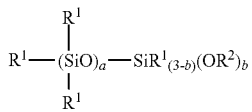
(1)

wherein $R^1$ may be the same or different and represents a monovalent hydrocarbon group, $R^2$ represents an alkyl group, an alkoxyl group, an alkenyl group or an acyl group, a is an integer of 5 to 100, and b is an integer of 1 to 3.

2. The composition as defined in claim 1, further comprising
(G-2) 0.1 to 100 parts by weight, relative 100 parts by weight of component (A), of an alkoxysilane compound represented by the general formula (2):

(2)

wherein $R^3$ independently represents an alkyl group having 6 to 15 carbon atoms, $R^4$ independently represents an unsubstituted or substituted monovalent hydrocarbon group having 1 to 8 carbon atoms, $R^5$ independently represents an alkyl group having 1 to 6 carbon atoms, c is an integer of 1 to 3 and d is an integer of 0 to 2 provided that the sum of c+d is an integer of 1 to 3.

3. A method for preparing the curable organopolysiloxane composition defined in claim 1, which method comprising the steps of:
(i) kneading components (A), (C), (D) and (G), and component (G-2), if contained, at a temperature that is within a range of 40 to 120° C. and is not lower than a melting point of component (C) to obtain a uniform mixture;
(ii) stopping the kneading and cooling the mixture by decreasing the temperature to lower than the melting point of component (C); and
(iii) adding components (B) and (E) and, if necessary, other optional ingredients and kneading at a temperature lower than the melting point of component (C) to obtain a uniform mixture.

4. A thermally conductive cured product obtained by curing at 80 to 180° C. a curable organopolysiloxane composition in the form of grease or paste, said curable composition comprising:
(A) 100 parts by weight of an organopolysiloxane having at least two alkenyl groups bonded to silicon atom in one molecule;

(B) an organohydrogenpolysiloxane having at least two hydrogen atoms bonded to silicone atom in the molecule in such an amount that the number of the hydrogen atoms bonded to the silicon atom in component (B) is at 0.1 to 5.0 per one alkenyl group in component (A);

(C) 7,000 to 20,000 parts by weight of gallium and/or a gallium alloy having a melting point of 0 to 70° C.;

(D) 10 to 1,000 parts by weight of a thermally conductive filler having an average particle size of 0.1 to 100 μm;

(E) 0.1 to 500 ppm, relative to the weight of component (A), of a platinum-based catalyst; and (G) 20 to 500 parts by weight of a polysiloxane of the following general formula (1):

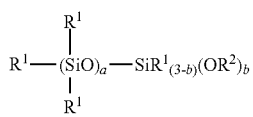
(1)

wherein $R^1$ may be the same or different and represents a monovalent hydrocarbon group, $R^2$ represents an alkyl group, an alkoxyl group, an alkenyl group or an acyl group, a is an integer of 5 to 100, and b is an integer of 1 to 3.

5. A thermally conductive layer comprising the thermally conductive cured product of claim 4 disposed between a heat generating electronic part and a heat radiating member.

6. A semiconductor device comprising a heat generating electronic part, a heat radiating member, and a thermally conductive layer made of the cured product defined in claim 4, wherein the heat generating electronic part and the heat radiating member are bonded through said thermally conductive layer.

7. A method for fabricating the semiconductor device defined in claim 6, which method comprising the steps of:
(a) coating the composition defined in claim 1 onto a surface of the heat generating electronic part to form a coating layer of the composition on the surface;
(b) subjecting the heat radiating member to pressure bonding and fixing to the coating layer; and
(c) treating the resulting structure at 80 to 180° C. to cure the coating layer thereby forming the thermally conductive layer.

* * * * *